United States Patent
Li et al.

(10) Patent No.: US 12,550,441 B2
(45) Date of Patent: Feb. 10, 2026

(54) DISPLAY SUBSTRATE, METHOD FOR MANUFACTURING SAME, AND DISPLAY DEVICE

(71) Applicants: Chongqing BOE Display Technology Co., Ltd., Chongqing (CN); BOE TECHNOLOGY GROUP CO., LTD., Beijing (CN)

(72) Inventors: Qiujie Li, Beijing (CN); Weiwei Hou, Beijing (CN); Shuanzhu Li, Beijing (CN); Wentao Wang, Beijing (CN); Dawei Shi, Beijing (CN); Weixing Gong, Beijing (CN); Liqiang Niu, Beijing (CN)

(73) Assignees: Chongqing BOE Display Technology Co., Ltd., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 385 days.

(21) Appl. No.: 18/026,639

(22) PCT Filed: Jun. 29, 2022

(86) PCT No.: PCT/CN2022/102292
§ 371 (c)(1),
(2) Date: Mar. 16, 2023

(87) PCT Pub. No.: WO2024/000249
PCT Pub. Date: Jan. 4, 2024

(65) Prior Publication Data
US 2024/0290794 A1    Aug. 29, 2024

(51) Int. Cl.
*H01L 27/12* (2006.01)
*H10D 86/01* (2025.01)
(Continued)

(52) U.S. Cl.
CPC ......... *H10D 86/60* (2025.01); *H10D 86/0221* (2025.01); *H10D 86/423* (2025.01); *H10D 86/441* (2025.01); *H10K 59/1213* (2023.02)

(58) Field of Classification Search
CPC .... H10D 86/60; H10D 86/0221; H10D 86/01; H10D 86/423; H10D 86/40;
(Continued)

(56) References Cited

U.S. PATENT DOCUMENTS 9,698,167 B2 * 7/2017 Lee ...................... H10D 86/427
10,446,589 B2 * 10/2019 Lou ...................... G09G 3/3225
(Continued)

FOREIGN PATENT DOCUMENTS

| CN | 103456744 A | 12/2013 |
|---|---|---|
| CN | 106298857 A | 1/2017 |

(Continued)

*Primary Examiner* — Nikolay K Yushin
(74) *Attorney, Agent, or Firm* — WHDA, LLP

(57) ABSTRACT

The present application provides a display substrate, a method for manufacturing the same, and a display device, which belongs to the technical field of displays. The display substrate includes: a base substrate and a plurality of sub-pixels on the base substrate, the sub-pixels include a sub-pixel driving circuit and a light-emitting element. The sub-pixel driving circuit includes: a first transistor and a second transistor; an active layer structure of the first transistor includes a first active layer and a second active layer connected to the first active layer. The second active layer is located at a side of the first active layer away from the base substrate, the first active layer includes a first active portion and a second active portion which are independent from each other, and the first active portion and the second active portion are connected to two ends of the second active layer, respectively.

14 Claims, 9 Drawing Sheets

(51) Int. Cl.
*H10D 86/40* (2025.01)
*H10D 86/60* (2025.01)
*H10K 59/121* (2023.01)

(58) Field of Classification Search
CPC .... H10D 86/441; H10D 86/00; H10D 86/471; H10K 59/1213; H10K 59/121; H10K 59/131; H10K 59/1201; H10K 59/878
See application file for complete search history.

(56) References Cited

U.S. PATENT DOCUMENTS

| | | | |
|---|---|---|---|
| 2016/0020230 A1* | 1/2016 | Lee | H10D 86/60 257/43 |
| 2018/0190743 A1 | 7/2018 | Shi | |
| 2019/0165004 A1* | 5/2019 | Lou | H10D 99/00 |
| 2020/0135774 A1 | 4/2020 | Li et al. | |
| 2022/0123120 A1 | 4/2022 | Lee et al. | |
| 2023/0216002 A1* | 7/2023 | Yi | H10H 20/853 257/79 |

FOREIGN PATENT DOCUMENTS

| | | |
|---|---|---|
| CN | 107978610 A | 5/2018 |
| CN | 110060998 A | 7/2019 |
| CN | 114335023 A | 4/2022 |
| CN | 114388533 A | 4/2022 |

\* cited by examiner

DISPLAY SUBSTRATE, METHOD FOR MANUFACTURING SAME, AND DISPLAY DEVICE

This application is the U.S. national phase of PCT Application No. PCT/CN2022/102292 filed on Jun. 29, 2022, the entire contents of which are hereby incorporated by reference.

TECHNICAL FIELD

The present disclosure relates to the technical field of displays, and more particularly, relates to a display substrate, a method for manufacturing the same, and a display device.

BACKGROUND

The development of AMOLED (Active Matrix Organic Light Emitting Diode) display technology is gradually matured. With the increasing requirements for the display effect of AMOLED display screen, the demand for power consumption and display effect of AMOLED products is gradually increasing. The product attribute of adaptive refresh rate becomes a big process goal. In order to achieve the goal of low power consumption and adaptive refresh rate, LTPO technology emerges.

LTPS (low temperature poly-silicon) has the advantages such as ultra-high electron mobility, high resolution, high response speed, high brightness, and high aperture ratio, but it is not suitable for low refresh rate due to the high electron mobility, large leakage current, and large driving power consumption. Compared with LTPS, the metal oxide semiconductor (IGZO) has the advantages such as lower electron mobility, better uniformity, transparency, and simple fabrication process. Moreover, compared with the leakage current of IGZO, it can ensure the stability at a low refresh rate and a lower power consumption.

LTPO combines a LTPS with a metal oxide semiconductor to reduce the power consumption for exciting pixel points, so as to reduce power consumption during screen display.

SUMMARY

The technical problem to be solved in the present disclosure is to provide a display substrate, a method for manufacturing the same, and a display device, which can improve the yield of the display substrate.

In order to solve the above technical problem, technical solutions provided by embodiments of the present disclosure are as follows.

In one aspect, a display substrate is provided, including: a base substrate and a plurality of sub-pixels arranged on the base substrate, the sub-pixels including a sub-pixel driving circuit and a light-emitting element, where the sub-pixel driving circuit includes:

a first transistor and a second transistor;
an active layer structure of the first transistor includes a first active layer and a second active layer connected to the first active layer, the second active layer is located at a side of the first active layer away from the base substrate, the first active layer includes a first active portion and a second active portion that are independent from each other, and the first active portion and the second active portion are respectively connected to two ends of the second active layer,
where the first active layer and the second active layer are made of different materials, and the first active layer and an active layer of the second transistor are arranged in a same layer and made of a same material.

In some embodiments, the first active layer is made of polysilicon; the second active layer is made of a metal oxide semiconductor.

In some embodiments, the first transistor further includes: a gate electrode located on a side of the second active layer facing the base substrate, where the gate electrode is located on a side of the first active layer away from the base substrate.

In some embodiments, the gate electrode of the first transistor and a gate electrode of the second transistor are arranged in a same layer and made of a same material.

In some embodiments, the display substrate includes the first active layer, a first gate insulating layer, the gate electrode, a second gate insulating layer, the second active layer that are located on the base substrate in sequence, where the display substrate includes an opening penetrating the first gate insulating layer and the second gate insulating layer, and the second active layer is connected to the first active layer via the opening.

In some embodiments, the display substrate further includes an intermediate insulating layer located on a side of the second active layer away from the base substrate, where an orthographic projection of the intermediate insulating layer onto the base substrate covers an orthographic projection of the opening onto the base substrate; and a source electrode and a drain electrode located at a side of the intermediate insulating layer away from the base substrate, where the source electrode and the drain electrode of the first transistor are connected to the first active layer through a via hole penetrating an insulating layer, and the insulating layer is the intermediate insulating layer, or the intermediate insulating layer, the first gate insulating layer and the second gate insulating layer. The source electrode and the drain electrode of the second transistor are connected to the active layer of the second transistor through a via hole penetrating the intermediate insulating layer, the first gate insulating layer, and the second gate insulating layer.

In some embodiments, in the first transistor, an orthographic projection of the via hole onto the base substrate at least partially overlaps the orthographic projection of the opening onto the base substrate; or an orthographic projection of the via hole onto the base substrate does not overlap the orthographic projection of the opening onto the base substrate.

In some embodiments, the display substrate includes a plurality of power supply lines, a plurality of light-emitting control lines, a plurality of gate lines, a plurality of data lines, a plurality of reset lines and a plurality of initialization signal lines;

the sub-pixel driving circuit includes a reset transistor, a compensation transistor, a data writing transistor, an initialization transistor, a first light-emitting control transistor, a second light-emitting control transistor, and a driving transistor;
a gate electrode of the reset transistor is coupled to a corresponding one of the reset lines, a first electrode of the reset transistor is coupled to a corresponding one of the initialization signal lines, and a second electrode of the reset transistor is coupled to a gate electrode of the driving transistor;
a gate electrode of the compensation transistor is coupled to a corresponding one of the gate lines, a first electrode of the compensation transistor is coupled to the gate electrode of the driving transistor, and a second electrode of the compensation transistor is coupled to a drain electrode of the driving transistor;

a gate electrode of the data writing transistor is coupled to a corresponding one of the gate lines, a first electrode of the data writing transistor is coupled to a corresponding one of the data lines, and a second electrode of the data writing transistor is coupled to a source electrode of the driving transistor;

a gate electrode of the first light-emitting control transistor is coupled to a corresponding one of the light-emitting control lines, a first electrode of the first light-emitting control transistor is coupled to a first electrode of a light-emitting unit, and a second electrode of the first light-emitting control transistor is coupled to the drain electrode of the driving transistor;

a gate electrode of the second light-emitting control transistor is coupled to a corresponding one of the light-emitting control lines, a first electrode of the second light-emitting control transistor is coupled to a corresponding one of the power supply lines, and a second electrode of the second light-emitting control transistor is coupled to the source electrode of the driving transistor; and a gate electrode of the initialization transistor is coupled to a corresponding one of the gate lines, a first electrode of the initialization transistor is coupled to a corresponding one of the initialization signal lines, and a second electrode of the initialization transistor is coupled to the first electrode of the light-emitting unit.

In some embodiments, the first transistor includes the reset transistor, the compensation transistor, the data writing transistor, and the initialization transistor; or the first transistor includes the reset transistor and the compensation transistor.

In some embodiments, an orthographic projection of the first active layer of the first transistor onto the base substrate does not overlap orthographic projections of the gate lines onto the base substrate.

In some embodiments, a connection line between the second electrode of the data writing transistor and the source electrode of the driving transistor includes first connection portions and a second connection portion, the first connection portion and the first active layer are arranged in the same layer and made of the same material, the second connection portion is fabricated by a source and drain metal layer, the first connection portions are broken at a position where the connection line and the light-emitting control line intersect, and the broken first connection portions are connected through the second connection portion.

Embodiments of the present disclosure also provide a display device, including the above display substrate.

Embodiments of the present disclosure also provide a method for manufacturing a display substrate, including: forming a plurality of sub-pixels on a base substrate, the sub-pixels including a sub-pixel driving circuit and a light-emitting element, where forming the sub-pixel driving circuit includes:

forming a first transistor and a second transistor;

an active layer structure of the first transistor includes a first active layer and a second active layer connected to the first active layer, the second active layer is located at a side of the first active layer away from the base substrate, the first active layer includes a first active portion and a second active portion that are independent from each other, and the first active portion and the second active portion are respectively connected to two ends of the second active layer, where the first active layer and the second active layer are made of different materials, and the first active layer and the active layer of the second transistor are formed by one patterning process.

In some embodiments, the method includes: forming the second active layer in a wet etching process.

Embodiments of the present disclosure have the following beneficial effects.

In the above solutions, the first active layer and the active layer of the second transistor are arranged in a same layer and made of a same material, so that when a via hole exposing the active layer of the second transistor is formed, the same patterning process can be used to form the via hole exposing the first active layer, so that the source electrode and the drain electrode of the first transistor are connected to the first active layer through the via hole. Since the first active layer and the active layer of the second transistor are arranged in the same layer, the etching depths of multiple via holes exposing the first active layer are the same or substantially the same, which can avoid situations such as non-uniform critical dimensions and abnormal slope angles caused by different depths of via holes, thereby ensuring the product yield.

REFERENCE NUMERALS

Figure 1:
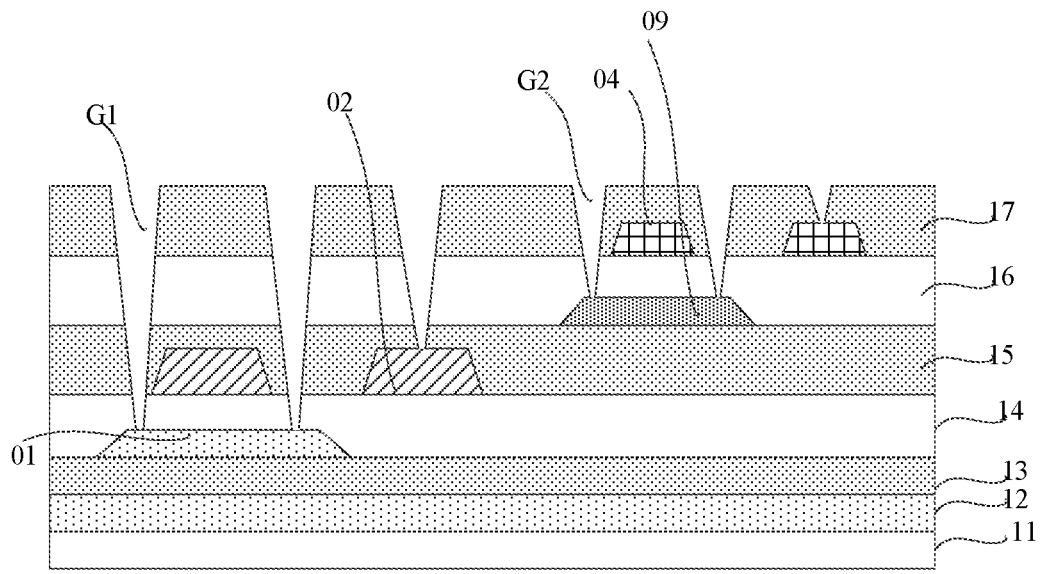
FIG. 1 is a schematic diagram of a display substrate in the prior art.

01: polysilicon layer
02: first gate metal layer
04: second gate metal layer
03: opening
05: via hole
08: first electrode of light-emitting unit
09: metal oxide semiconductor layer
10: second active layer
11: rigid substrate
12: buffer layer
13: substrate
14: first gate insulating layer
15: first intermediate insulating layer
16: second gate insulating layer
17: second intermediate insulating layer
18: second gate insulating layer
20: intermediate insulating layer
21, 22, 23, 24: via holes
G1, G2: via holes
31: first active portion
32: second active portion

DETAILED DESCRIPTION

In order to make the to-be-solved technical problems, technical solutions, and advantages of embodiments of the present disclosure more apparent, a detailed description will be given below with reference to the drawings and specific embodiments.

As shown in FIG. 1, in a display substrate of the LTPO technology, an active layer of a LTPO thin film transistor include a polysilicon layer 01 and a metal oxide semiconductor layer 09, where the polysilicon layer 01 and the metal oxide semiconductor layer 09 are located at different film layers. In order to connect the polysilicon layer 01 and the metal oxide semiconductor layer 09, a via hole G1 penetrating a first gate insulating layer 14, a first intermediate insulating layer 15, a second gate insulating layer 16, and a second intermediate insulating layer 17 needs to be formed to expose the polysilicon layer 01, and a via hole G2 penetrating the second gate insulating layer 16 and the second intermediate insulating layer 17 also needs to be formed to expose the metal oxide semiconductor layer 09. The via hole G1 and the via hole G2 have different etching depths, which may causes that key dimensions of the via hole G1 and the via hole G2 are not uniform and the gradient angle is abnormal, and affects the product yield.

In order to solve the above technical problems, embodiments of the present disclosure provide a display substrate, a method for manufacturing the same, and a display device, which can improve the yield of the display substrate.

Embodiments of the present disclosure provide a display substrate, which, as shown in FIG. 2 to FIG. 9, includes: a base substrate 13 and a plurality of sub-pixels arranged on the base substrate 13, the sub-pixels including a sub-pixel driving circuit and a light-emitting element OLED. The sub-pixel driving circuit includes: a first transistor B and a second transistor A, the second transistor A including only one active layer. An active layer structure of the first transistor B includes a first active layer and a second active layer 10 connected to the first active layer, the second active layer 10 is located at a side of the first active layer away from the base substrate 13, the first active layer includes a first active portion 31 and a second active portion 32 that are independent from each other, and the first active portion 31 and the second active portion 32 are respectively connected to two ends of the second active layer 10. The first active layer and the second active layer 10 are made of different materials, and the first active layer and the active layer of the second transistor are arranged in a same layer and made of a same material.

In the embodiments, the first active layer and the active layer of the second transistor are arranged in a same layer and made of a same material, so that when a via hole exposing the active layer of the second transistor is formed, the same patterning process can be used to form the via hole exposing the first active layer, so that the source electrode and the drain electrode of the first transistor are connected to the first active layer through the via hole. Since the first active layer and the active layer of the second transistor are arranged in the same layer, the etching depths of a plurality of via holes exposing the first active layer are the same or substantially the same, which can avoid situations such as non-uniform critical dimensions and abnormal slope angles caused by different depths of the via holes, thereby ensuring product yield.

Illustratively, the display substrate includes a plurality of sub-pixels and the plurality of sub-pixels includes a plurality of sub-pixel driving circuits distributed in an array. The plurality of sub-pixel driving circuits are divided into multiple rows of sub-pixel driving circuits and multiple columns of sub-pixel driving circuits. The multiple rows of sub-pixel driving circuits are arranged in a first direction and each row of sub-pixel driving circuits includes a plurality of sub-pixel driving circuits arranged in a second direction. The multiple columns of sub-pixel driving circuits are arranged in the second direction and each column of sub-pixel driving circuits includes a plurality of sub-pixel driving circuits arranged in the first direction. Illustratively, the first direction intersects the second direction. For example, the first direction includes a longitudinal direction and the second direction includes a transverse direction.

Illustratively, the sub-pixels include a sub-pixel driving circuit and a light-emitting element OLED. The sub-pixel driving circuit is coupled to an anode of the light-emitting element OLED for supplying a driving signal to the light-emitting element OLED, so as to drive the light-emitting element OLED to emit light.

Illustratively, the above sub-pixel driving circuit may adopt 7T1C (i.e., 7 transistors and one capacitor), but is not limited thereto.

Illustratively, the base substrate 13 may be a flexible substrate or a rigid substrate. When the base substrate 13 is a flexible substrate, the base substrate 13 is formed on the rigid substrate 11. In addition, a buffer layer 12 is also arranged between the base substrate 13 and the rigid substrate 11. The buffer layer 12 may be made of SiOx (silicon oxide), SiNx (silicon nitride), SiON (silicon oxynitride), and the like, and may also be made of High k materials, such as AlOx (aluminium oxide), HfDx (hafnium oxide), TaOx (tantalum oxide), and the like, and may be in a single layer, multiple layers, or a composite layer.

In some embodiments, the first active layer is made of polysilicon and the second active layer is made of a metal oxide semiconductor, such as amorphous indium gallium zinc oxide material a-IGZO, zinc oxide nitride ZnON, indium zinc tin oxide IZTO, or IGZO. The first transistor is a LTPO transistor and the lowest refresh rate of the screen can be 1 Hz based on the LTPO transistor. The lower refresh rate would bring lower power consumption and a large amount of power is saved by reducing the refresh rate. The first active layer is not limited to be made of polysilicon, and the second active layer is not limited to be made of a metal oxide semiconductor and other semiconductor materials may be used.

Figure 8:
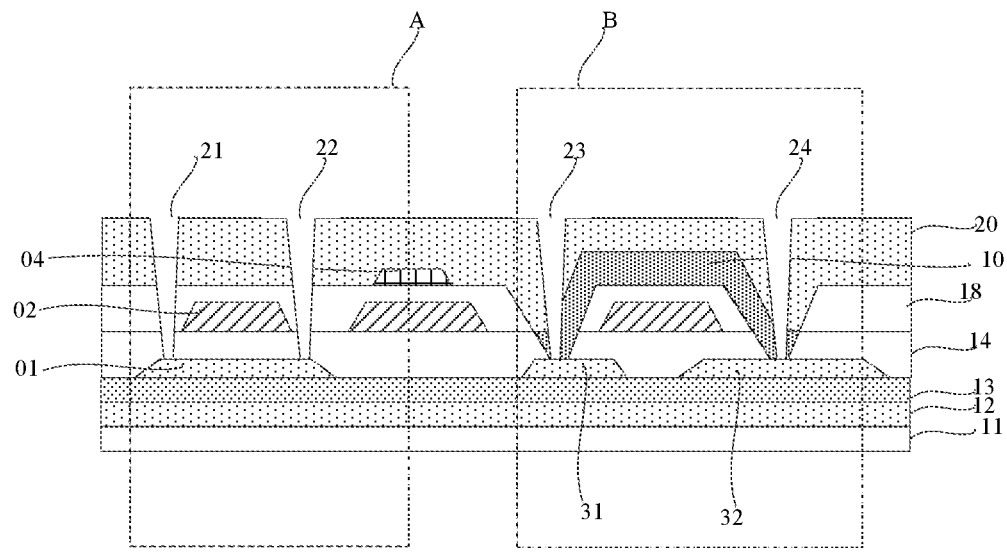
Figure 9:
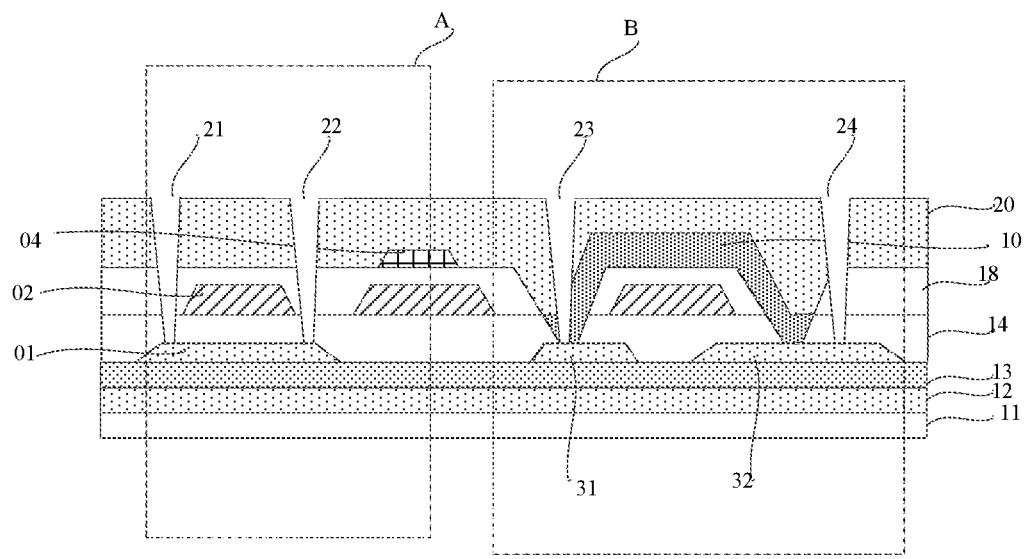

As shown in FIG. 8 and FIG. 9, the display substrate includes a first active layer, a first gate insulating layer 14, a first gate metal layer 02, a second gate insulating layer 18, a second gate metal layer 04, and an intermediate insulating layer 20 which are located on a base substrate 13. The first gate metal layer 02 is configured to form a gate electrode of a second transistor A and a gate electrode of a first transistor B; the second gate metal layer 04 is configured to form a storage capacitor; the first active layer includes a first active portion 31 and a second active portion 32 which are independent from each other; and the first active layer and the active layer of the second transistor A are arranged in a same layer and made of a same material, and are both made of polysilicon layers 01.

Figure 2:
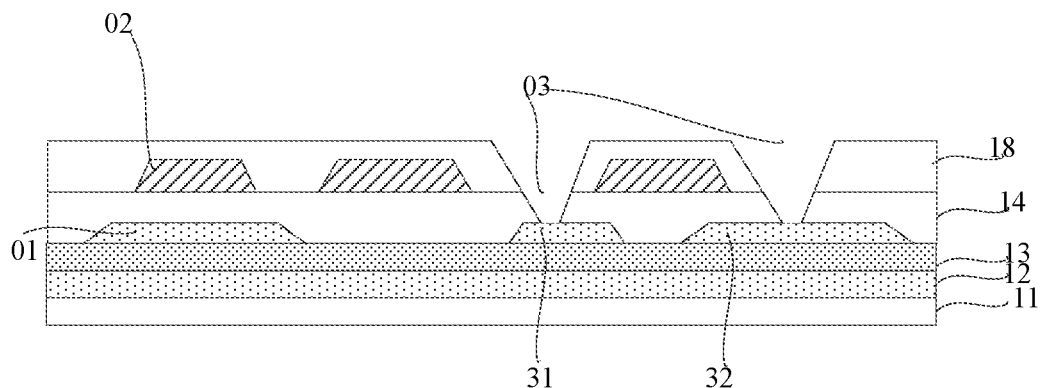
FIG. 2 to FIG. 9 each is a schematic cross-section diagram of a display substrate according to embodiments of the present disclosure.
Figure 3:
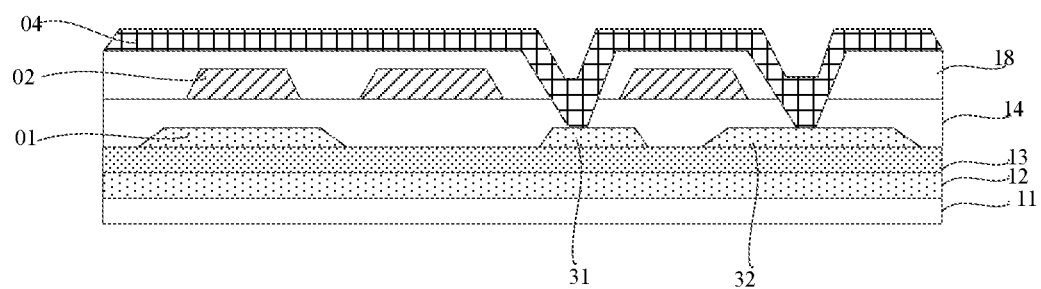
Figure 4:
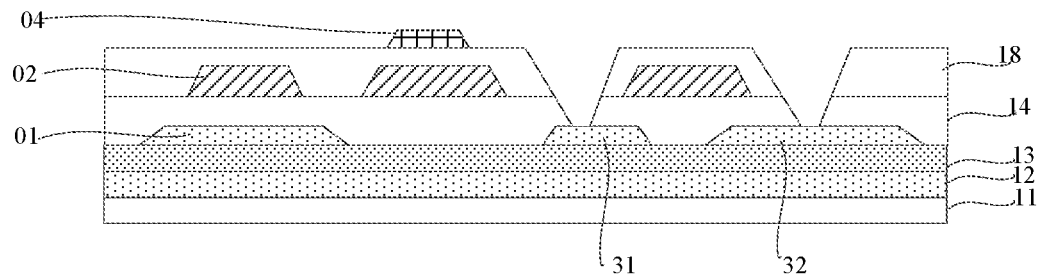
Figure 5:
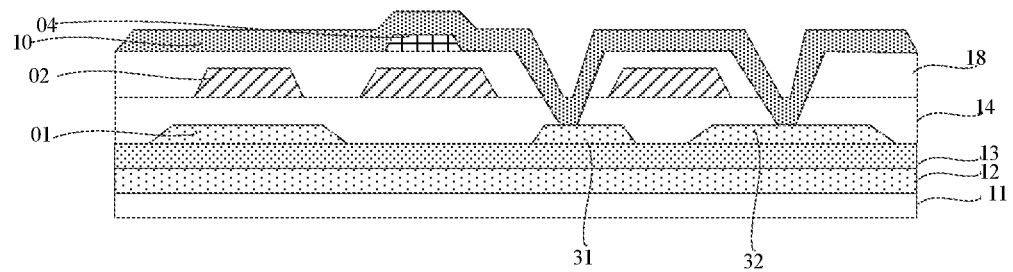
Figure 6:
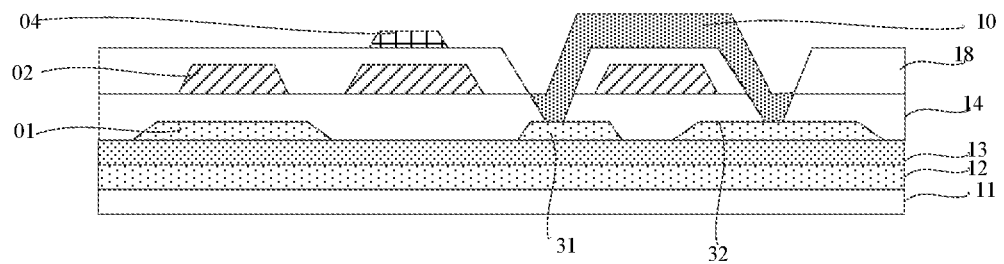

As shown in FIG. 2, after the second gate insulating layer 18 is formed, the second gate insulating layer 18 and the first gate insulating layer 14 are etched, and an opening 03 exposing the first active portion 31 and the second active portion 32 is formed. Then, as shown in FIG. 3, a second gate metal layer 04 is formed and the second gate metal layer 04 is etched, to form a pattern of the second gate metal layer 04 as shown in FIG. 4. Then, as shown in FIG. 5, a second active layer 10 is formed. As shown in FIG. 6, the second active layer 10 is etched to form a pattern of the second active layer 10. The second active layer 10 is connected to the first active portion 31 and the second active portion 32 through the opening 03, and the second active layer 10, the first active portion 31 and the second active portion 32 together constitute an active layer structure of the first transistor B.

In the embodiments, the first active portion 31 and the second active portion 32 are arranged in a same layer and made of a same material as the active layer of the second transistor A. After the second gate insulating layer 18 is formed, the second gate insulating layer 18 and the first gate insulating layer 14 are etched and a via hole exposing the first active portion 31 and the second active portion 32 is formed. Then a gate electrode of the thin film transistor is formed, and the second active layer 10 is formed and connected to the first active portion 31 and the second active portion 32. The gate electrode of the first transistor B and the gate electrode of the second transistor A are arranged in a same layer and made of a same material and can be obtained by one patterning process, thus reducing the number of patterning processes for manufacturing a display substrate and reducing the manufacturing cost of the display substrate. The first active portion 31 and the second active portion 32 are arranged in a same layer and made of a same material as the active layer of the second transistor A, and can be obtained by one patterning process, thus reducing the number of patterning processes for manufacturing a display substrate and reducing the manufacturing cost of the display substrate.

Figure 7:
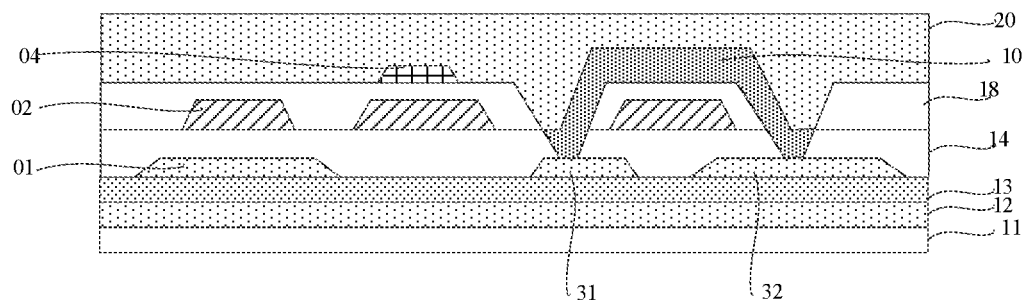

As shown in FIG. 7 to FIG. 9, an intermediate insulating layer 20 is arranged on a side of the second active layer 10 away from the base substrate, and the intermediate insulating layer 20 may be made of SiOx, SiNx, SiON, and the like, and may also be made of High k materials, such as AlOx, HfOx, TaOx, and the like, and may be of a single layer, multiple layers, or a composite layer. An orthographic projection of the intermediate insulating layer 20 onto the base substrate covers an orthographic projection of the opening onto the base substrate.

In order to enable the source electrode and the drain electrode of the thin film transistor to be in communication with the active layer, the intermediate insulating layer 20 is etched to form via holes 21, 22, 23, and 24 exposing the active layer, the first active portion 31, and the second active portion 32 of the second transistor A. The source electrode of the second transistor A is connected to the polysilicon layer 01 through the via hole 21, the drain electrode of the second transistor A is connected to the polysilicon layer 01 through the via hole 22, the source electrode of the first transistor B is connected to the first active portion 31 through the via hole 23, and the drain electrode of the first transistor B is connected to the second active portion 32 through the via hole 24. Since the active layer of the second transistor, the first active portion 31, and the second active portion 32 are located on the same layer, the etching depths of the via holes 21, 22, 23, and 24 are substantially the same, thus avoiding situations such as non-uniform critical dimensions and abnormal slope angles due to different via depths and ensuring product yield.

In the embodiments, in the first transistor B, an orthographic projection of the via hole onto the base substrate at least partially overlaps with the orthographic projection of the opening onto the base substrate, for example, the orthographic projection of the opening onto the base substrate may be located within the orthographic projection of the via hole onto the base substrate; or the orthographic projection of the via hole onto the base substrate does not overlap with the orthographic projection of the opening onto the base substrate, as long as the source electrode and the drain electrode of the thin film transistor can be connected to the first active layer.

As shown in FIG. 8, in the first transistor B, orthographic projections of the via hole 23 and the via hole 24 onto the base substrate is located within the orthographic projection of the opening onto the base substrate. As such, before forming the intermediate insulating layer 20, the first gate insulating layer 14 and the second gate insulating layer 18 in a region where the via hole 23 and the via hole 24 are located have been removed, and after forming the intermediate insulating layer 20, the via hole 23 and the via hole 24 are only required to penetrate the intermediate insulating layer when preparing via holes. However, in the second transistor A, after forming the intermediate insulating layer 20, when preparing via holes, the via hole 21 and the via hole 22 are required to penetrate the first gate insulating layer 14, the second gate insulating layer 18, and the intermediate insulating layer 20, and after preparing the intermediate insulating layer 20, the surface of the side of the intermediate insulating layer 20 away from the base substrate is not completely flat, and therefore the etching depths of the via hole 21 and the via hole 22 and the via hole 23 and the via hole 24 cannot be completely the same. In order to ensure that the etching depth of the via hole of the second transistor A is substantially the same as that of the via hole of the first transistor B, as shown in FIG. 9, the position of the via hole of the first transistor may be designed, for example, the orthographic projection of the via hole 24 onto the base substrate does not overlap the orthographic projection of the opening onto the base substrate, so that at the position of the via hole 24, the first gate insulating layer 14 and the second gate insulating layer 18 are still retained, and the via hole 24 is required to penetrate the first gate insulating layer 14, the second gate insulating layer 18, and the intermediate insulating layer 20, which enables the via hole 21 and the via hole 22 to be etched to substantially the same depth as the via hole 24. Similarly, for the via hole 23, the position of the via hole 23 may be designed so that the orthographic projection of the via hole 23 onto the base substrate does not overlap the orthographic projection of the opening onto the base substrate.

Figure 10A:
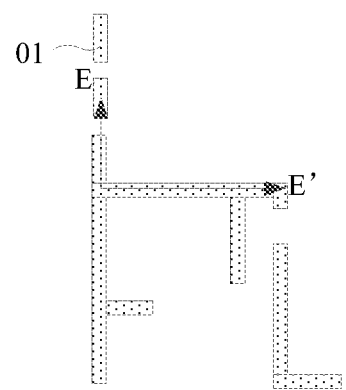
FIG. 10a to FIG. 10h each is a schematic diagram showing the layout of a display substrate according to an embodiment of the present disclosure.
Figure 10B:
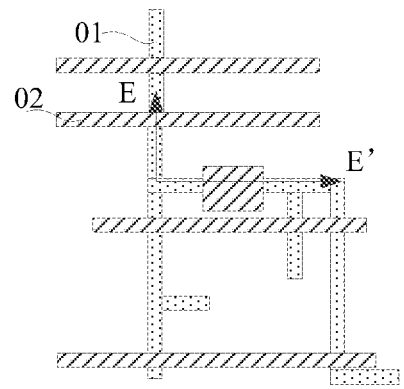
Figure 10C:
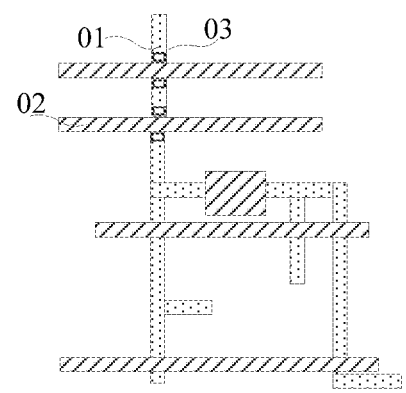
Figure 10D:
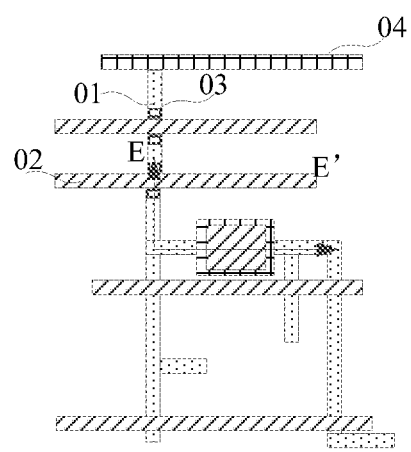
Figure 10E:
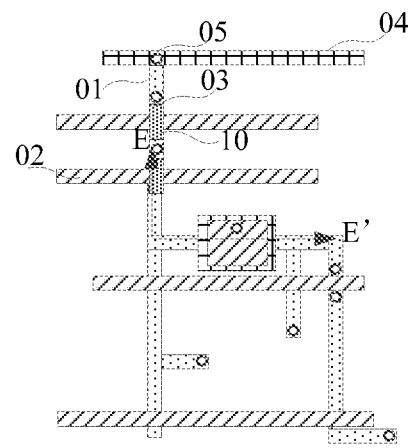
Figure 10F:
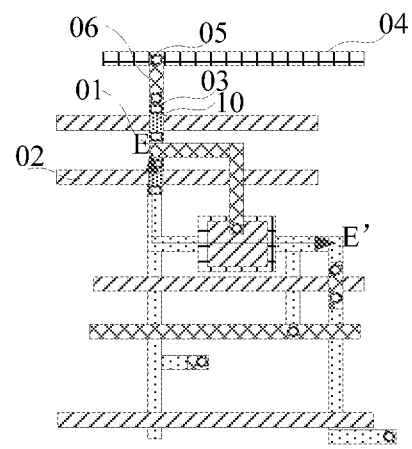
Figure 10G:
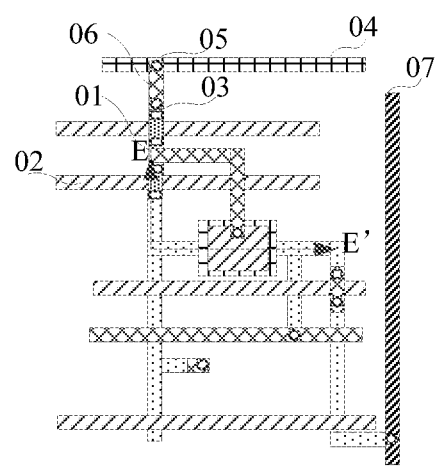
Figure 10H:
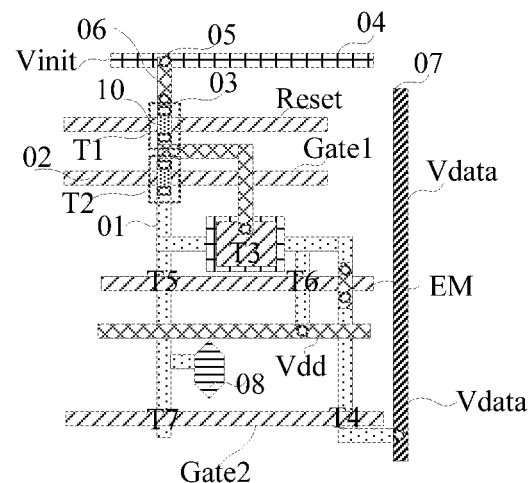
Figure 11A:
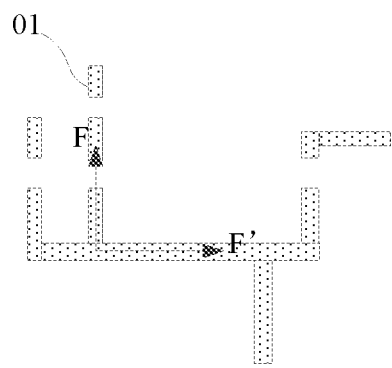
FIG. 11a to FIG. 11h each is a schematic diagram showing the layout of a display substrate according to another embodiment of the present disclosure.
Figure 11B:
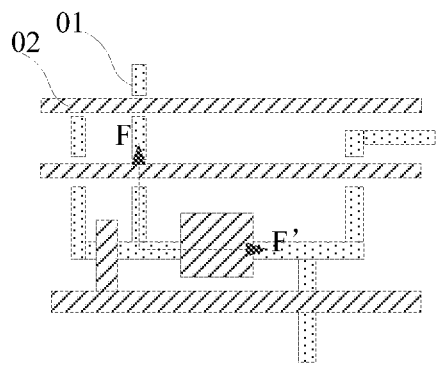
Figure 11C:
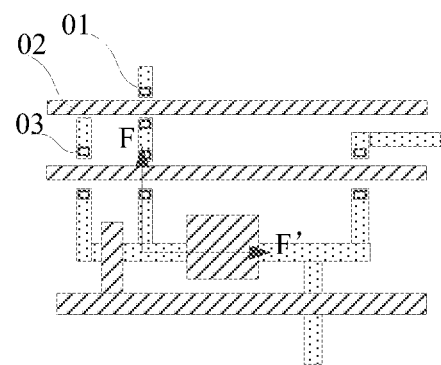
Figure 11D:
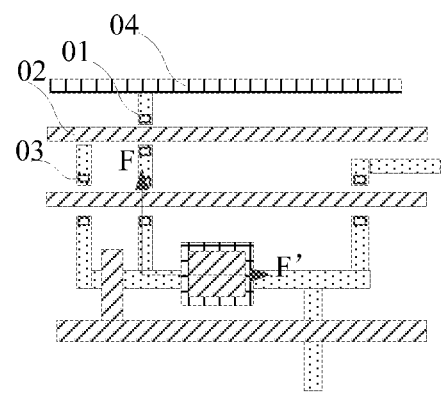
Figure 11E:
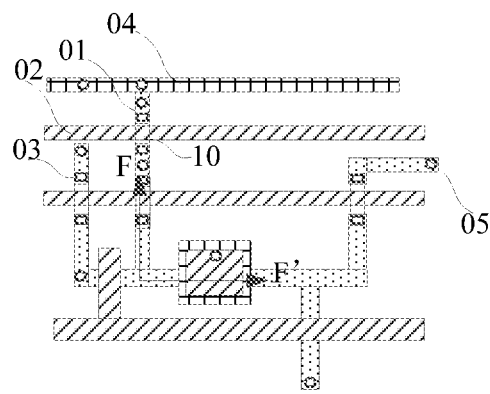
Figure 11F:
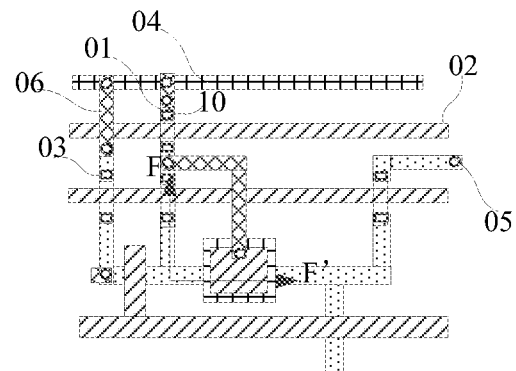
Figure 11G:
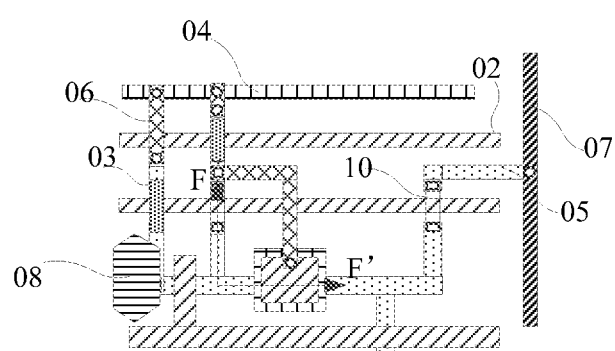
Figure 11H:
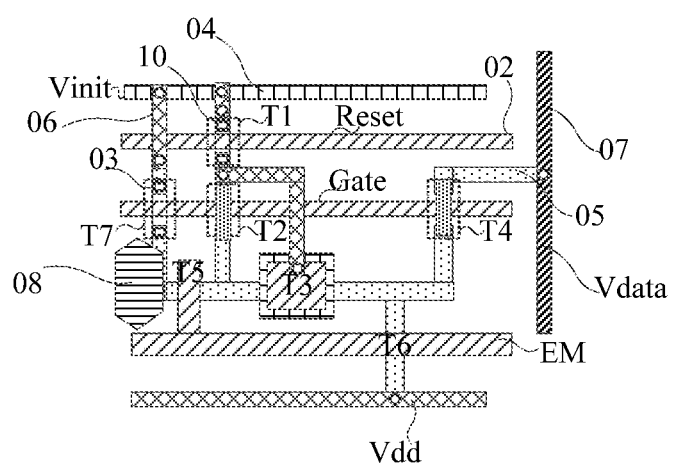

In some embodiments, as shown in FIG. 10h and FIG. 11h, the display substrate includes a plurality of power supply lines Vdd, a plurality of light-emitting control lines EM, a plurality of gate lines Gate, a plurality of data lines Vdata, a plurality of reset lines Reset, and a plurality of initialization signal lines Vinit;

the sub-pixel driving circuit includes: a reset transistor T1, a compensation transistor T2, a data writing transistor T4, an initialization transistor T7, a first light-emitting control transistor T5, a driving transistor T3, and a second light-emitting control transistor T6;

a gate electrode of the reset transistor T1 is coupled to a corresponding one of the reset line Reset, a first electrode of the reset transistor T1 is coupled to a corresponding one of the initialization signal line Vinit, and a second electrode of the reset transistor T1 is coupled to a gate electrode of the driving transistor T3;

a gate electrode of the compensation transistor T2 is coupled to a corresponding one of the gate line, a first electrode of the compensation transistor T2 is coupled to a gate electrode of the driving transistor T3, and a second electrode of the compensation transistor T2 is coupled to a drain electrode of the driving transistor T3;

a gate electrode of the data writing transistor T4 is coupled to a corresponding one of the gate line, a first electrode of the data writing transistor T4 is coupled to a corresponding one of the data line Vdata, and a second electrode of the data writing transistor T4 is coupled to a source electrode of the driving transistor T3;

a gate electrode of the first light-emitting control transistor T5 is coupled to a corresponding one of the light-emitting control line EM, a first electrode of the first light-emitting control transistor T5 is coupled to a first electrode 08 of the light-emitting unit, and a second electrode of the first light-emitting control transistor T5 is coupled to the drain electrode of the driving transistor T3;

a gate electrode of the second light-emitting control transistor T6 is coupled to a corresponding one of the light-emitting control line EM, a first electrode of the second light-emitting control transistor T6 is coupled to a corresponding one of the power supply line Vdd, and a second electrode of the second light-emitting control transistor T6 is coupled to a source electrode of the driving transistor T3; and a gate electrode of the initialization transistor T7 is coupled to a corresponding one of the gate line, a first electrode of the initialization transistor T7 is coupled to the corresponding initialization signal line, and a second electrode of the initialization transistor T7 is coupled to the first electrode 08 of a light-emitting unit.

In this embodiment, the display substrate may include four LTPO transistors, as shown in FIG. 11h; the display substrate may also include two LTPO transistors, as shown in FIG. 10h. In FIG. 1h, the first transistor includes the reset transistor T1, the compensation transistor T2, the data writing transistor T4, and the initialization transistor T7, i.e., the reset transistor T1, the compensation transistor T2, the data writing transistor T4, and the initialization transistor T7 are LTPO transistors, and the other transistors are second transistors. In FIG. 10h, the first transistor includes the reset transistor T1 and the compensation transistor T2, i.e., the reset transistor T1 and the compensation transistor T2 are LTPO transistors, and the other transistors are second transistors.

The pixel circuit structure shown in FIG. 11h can reduce the number of a gate line compared to the pixel circuit structure shown in FIG. 10h.

In some embodiments, as shown in FIG. 10a and FIG. 10b, the orthographic projection of the first active layer of the first transistor, i.e., the polysilicon layer 01, onto the base substrate does not overlap with the orthographic projection of the gate line Gate1 onto the base substrate. As shown in FIG. 11a and FIG. 11b, the orthographic projection of the first active layer of the first transistor, i.e., the polysilicon layer 01, onto the base substrate does not overlap with the orthographic projection of the gate line Gate onto the base substrate. Since the orthographic projection of the opening 03 onto the base substrate is located within the orthographic projection of the first active portion 31 and the second active portion 32 onto the base substrate, the orthographic projection of the opening 03 onto the base substrate does not overlap with the orthographic projection of the first gate metal layer 02 onto the base substrate. The second active layer 10 is filled in the opening 03, a semi-surrounding structure for the gate electrode of the first transistor can be formed, and a three-dimensional channel surrounding the gate electrode of the first transistor can be formed. The channel width of the thin film transistor can be increased, and the width-to-length ratio of the thin film transistor channel can be increased by the structure of the three-dimensional channel surrounding the gate electrode, thus the on-state current of the thin film transistor is increased. At the same time, the conduction ability of the gate electrode to the channel is enhanced with the structure of the three-dimensional channel surrounding the gate electrode, so that the working stability of the thin film transistor is effectively improved. In addition, the area of the thin film transistor is effectively reduced by the structure in which the three-dimensional channel surrounds the gate electrode, which is advantageous for improving the aperture ratio of the display device and satisfying the requirement of high resolution.

In some embodiments, a connection line between the second electrode of the data writing transistor T4 and the source electrode of the driving transistor T3 includes a first connection portion and a second connection portion, the first connection portion and the first active layer are arranged in a same layer and made of a same material. The second connection portion is formed with a source and drain metal layer, the first connection portion is broken at position where the connection line and the light-emitting control line EM intersect to avoid signal influence, and the broken first connection portions are connected through the second connection portion.

Embodiments of the present disclosure also provide a display device, including the above display substrate.

The display device includes, but is not limited to: a radio frequency unit, a network module, an audio output unit, an input unit, a sensor, a display unit, a user input unit, an interface unit, a memory, a processor, a power supply. It will be appreciated by those skilled in the art that the configuration of the display device described above is not intended to be limiting and that the display device may include more or fewer of the components described above, or some combinations of the components, or different arrangements of the components. In embodiments of the present disclosure, the display device includes, but not limited to, displays, cell phones, tablets, televisions, wearable electronics, navigation display devices, and the like.

The display device may include: any product or component with a display function, such as a television, a display, a digital photo frame, a mobile phone, a tablet computer. The display device further includes a flexible circuit board, a printed circuit board, and a back plate.

Embodiments of the present disclosure also provide a method for manufacturing a display substrate, as shown in FIG. 2 to FIG. 9, FIG. 10a to FIG. 10h, and FIG. 11a to FIG. 11h, including: forming a plurality of sub-pixels on a base substrate, the sub-pixel including a sub-pixel driving circuit and a light-emitting element OLED. Forming the sub-pixel driving circuit includes: forming a first transistor B and a second transistor A.

An active layer structure of the first transistor B includes a first active layer and a second active layer 10 connected to the first active layer, the second active layer 10 is located at one side of the first active layer away from the base substrate 13, the first active layer includes a first active portion 31 and a second active portion 32 that are independent from each other, and the first active portion 31 and the second active portion 32 is respectively connected to two ends of the second active layer 10. The first active layer and the second active layer are made of different materials, and the first active layer and the active layer of the second transistor are formed by one patterning process.

In this embodiment, the first active layer and the active layer of the second transistor are formed by one patterning process, and the first active layer and the active layer of the second transistor are arranged in a same layer and made of a same material, so that when a via hole exposing the active layer of the second transistor is formed, the same patterning process can be used to form the via hole exposing the first active layer. Thus, the source electrode and the drain electrode of the first transistor are connected to the first active layer through the via hole. Since the first active layer and the active layer of the second transistor are arranged in the same layer, the etching depths of via holes are the same or substantially the same, thus avoiding situations such as non-uniform critical dimensions and abnormal slope angles caused by different depths of via holes and ensuring product yield.

Illustratively, the display substrate includes a plurality of sub-pixels and the plurality of sub-pixels includes a plurality of sub-pixel driving circuits distributed in an array. The plurality of sub-pixel driving circuits are divided into multiple rows of sub-pixel driving circuits and multiple columns of sub-pixel driving circuits. The multiple rows of sub-pixel driving circuits are arranged in a first direction and each row of sub-pixel driving circuits includes a plurality of sub-pixel driving circuits arranged in a second direction. The multiple columns of sub-pixel driving circuits are arranged in the second direction and each column of sub-pixel driving circuits includes a plurality of sub-pixel driving circuits arranged in the first direction. Illustratively, the first direction intersects the second direction. For example, the first direction includes a longitudinal direction and the second direction includes a transverse direction.

Illustratively, the sub-pixels include a sub-pixel driving circuit and a light-emitting element OLED. The sub-pixel driving circuit is coupled to an anode of the light-emitting element OLED for supplying a driving signal to the light-emitting element OLED, so as to drive the light-emitting element OLED to emit light.

Illustratively, the above sub-pixel driving circuit may employ 7T1C (i.e., 7 transistors and one capacitor), but is not limited thereto.

In some embodiments, the first active layer is made of polysilicon and the second active layer is made of a metal oxide semiconductor, such as amorphous indium gallium zinc oxide material a-IGZO, zinc oxide nitride ZnON, indium zinc tin oxide IZTO, or IGZO. The first transistor is a LTPO transistor and the lowest refresh rate of the screen can be 1 Hz based on the LTPO transistor. The lower refresh rate would bring lower power consumption and a large amount of power is saved by reducing the refresh rate. The first active layer is not limited to be made of polysilicon, and the second active layer is not limited to be made of a metal oxide semiconductor and other semiconductor materials may be used.

In a specific example, as shown in FIG. 2 to FIG. 9 and FIG. 10a to FIG. 10h, a manufacturing method of the present embodiment includes the following steps.

As shown in FIG. 2, a rigid substrate 11 is provided, a buffer layer 12 and a base substrate 13 are formed on the rigid substrate 11, where the base substrate 13 may be a flexible substrate and is made of polyimide; the buffer layer 12 may be made of SiOx, SiNx, SiON, and the like, and may also be made of High k materials, such as AlOx, HfOx, and TaOx, and may be in a single layer, multiple layers, or a composite layer.

As shown in FIG. 2 and FIG. 10a, a pattern of the polysilicon layer 01 is formed, and the pattern of the polysilicon layer 01 includes a first active portion 31 and a second active portion 32 of the first transistor B and further includes an active layer of the second transistor. FIG. 2 is a schematic cross-sectional diagram of FIG. 10a in the direction EE'.

As shown in FIG. 2, a first gate insulating layer 14 is formed, where the first gate insulating layer 14 may be made of SiOx, SiNx, SiON, and the like, and may also be made of High k materials, such as AlOx, HfOx, and TaOx, and may be of a single layer, multiple layers, or a composite layer.

As shown in FIG. 2 and FIG. 10b, forming a pattern of the first gate metal layer 02 includes: forming a metal thin film, and patterning the metal thin film to form a pattern of the first gate metal layer 02, which includes a gate electrode of the first transistor B, a gate electrode of the second transistor, and a gate line Gate1. In order to simplify the structure of a sub-pixel driving circuit, the gate electrode of the first transistor B and the gate line Gate1 may be of an integral structure. The metal thin film may be made of a metal material, such as Ag, Cu, Al, and Mo, or alloy materials of the above metals, such as AlNd and MoNb, may be multi-layer metals, such as Mo/Cu/Mo, or may be a stack structure formed by a metal and a transparent conductive material, such as ITO/Ag/ITO. FIG. 2 is a schematic cross-sectional diagram of FIG. 10b in the EE' direction.

As shown in FIG. 2 and FIG. 10c, a second gate insulating layer 18 is formed, where the second gate insulating layer 18 may be made of SiOx, SiNx, SiON, and the like, and may also be made of High k materials, such as AlOx, HfOx, and TaOx, and may be a single layer, multiple layers, or a composite layer. The second gate insulating layer 18 is etched to form an opening 03. FIG. 2 is a schematic cross-sectional diagram of FIG. 10c in the EE' direction.

As shown in FIG. 3, FIG. 4 and FIG. 10d, forming a pattern of the second gate metal layer 04 including: forming a metal thin film, patterning the metal thin film, and forming a pattern of the second gate metal layer 04 as an electrode plate of a storage capacitor of a sub-pixel driving circuit. The metal thin film may be made of metal materials, such as Ag, Cu, Al, and Mo, or alloy materials of the above metals, such as AlNd and MoNb, may be multilayer metals, such as Mo/Cu/Mo, or may be a stack structure formed of a metal and a transparent conductive material, such as ITO/Ag/ITO. FIG. 4 is a schematic cross-sectional diagram of FIG. 10b in the EE' direction.

As shown in FIG. 5, a layer of metal oxide semiconductor material is deposited to form a second active layer 10, and the second active layer 10 may be made of IGZO.

As shown in FIG. 6 and FIG. 10e, the second active layer 10 is etched, and a pattern of the second active layer 10 is formed. In order to reduce the influence on the second gate metal layer, the second active layer 10 may be etched through a wet etching process, and the second active layer 10 is connected to the first active portion 31 and the second active portion 32 through the opening 03. FIG. 6 is a schematic cross-sectional diagram of FIG. 10e in the EE' direction.

As shown in FIG. 7, an intermediate insulating layer 20 is formed, where the intermediate insulating layer 20 may be made of SiOx, SiNx, SiON, and the like, and may also be made of High k materials, such as AlOx, HfOx, TaOx, and the like, and may be a single layer, multiple layers, or a composite layer. An orthographic projection of the intermediate insulating layer 20 onto the base substrate covers an orthographic projection of the opening onto the base substrate.

As shown in FIG. 8, FIG. 9, and FIG. 10f, the intermediate insulating layer 20 is etched to form a via hole 05. The via hole 05 includes via holes 21 to 24 and the via hole 05 exposes the active layer of the thin film transistor. FIG. 8 and FIG. 9 are schematic cross-sectional diagrams of FIG. 10f in the EE' direction.

As shown in FIG. 10g, a pattern of a source and drain metal layer 06 is formed, and the pattern of the source and drain metal layer 06 includes a source electrode and a drain electrode of the thin film transistor, and the source electrode and the drain electrode of the thin film transistor are connected to an active layer of the thin film transistor through the via hole 05.

As shown in FIG. 10h, a first electrode 08 of the light-emitting unit and a data line Vdata are formed, and the first electrode 08 of the light-emitting unit may be an anode of the light-emitting unit.

In the embodiments, the sub-pixel driving circuit includes: a reset transistor T1, a compensation transistor T2, a data writing transistor T4, an initialization transistor T7, a first light-emitting control transistor T5, and a second light-emitting control transistor T6;
  a gate electrode of the reset transistor T1 is coupled to a corresponding one of the reset line Reset, a first electrode of the reset transistor T1 is coupled to a corresponding one of the initialization signal line Vinit, and a second electrode of the reset transistor T1 is coupled to a gate electrode of the driving transistor T3;
  a gate electrode of the compensation transistor T2 is coupled to a corresponding one of the gate line, a first electrode of the compensation transistor T2 is coupled to a gate electrode of the driving transistor T3, and a second electrode of the compensation transistor T2 is coupled to a drain electrode of the driving transistor T3;
  a gate electrode of the data writing transistor T4 is coupled to a corresponding one of the gate line, a first electrode of the data writing transistor T4 is coupled to a corresponding one of the data line Vdata, and a second electrode of the data writing transistor T4 is coupled to a source electrode of the driving transistor T3;
  a gate electrode of the first light-emitting control transistor T5 is coupled to a corresponding one of the light-emitting control line EM, a first electrode of the first light-emitting control transistor T5 is coupled to a first electrode 08 of the light-emitting unit, and a second electrode of the first light-emitting control transistor T5 is coupled to the drain electrode of the driving transistor T3;
  a gate electrode of the second light-emitting control transistor T6 is coupled to a corresponding one of the light-emitting control line EM, a first electrode of the second light-emitting control transistor T6 is coupled to a corresponding one of the power supply line Vdd, and a second electrode of the second light-emitting control transistor T6 is coupled to a source electrode of the driving transistor T3; and
  a gate electrode of the initialization transistor T7 is coupled to a corresponding one of the gate line, a first electrode of the initialization transistor T7 is coupled to the corresponding initialization signal line, and a second electrode of the initialization transistor T7 is coupled to the first electrode 08 of a light-emitting unit.

The reset transistor T1 and the compensation transistor T2 are LTPO transistors, i.e., the first transistors, and the other transistors are the second transistors.

In another specific example, as shown in FIG. 2 to FIG. 9 and FIG. 11a to FIG. 11h, the manufacturing method according to an embodiment includes the following steps.

As shown in FIG. 2, a rigid substrate 11 is provided, a buffer layer 12 and a base substrate 13 are formed on the rigid substrate 11. The base substrate 13 may be a flexible substrate and is made of polyimide; the buffer layer 12 may be made of SiOx, SiNx, SiON, and the like, and may also be made of High k materials, such as AlOx, HfOx, and TaOx, and may be a in single layer, multiple layers, or a composite layer.

As shown in FIG. 2 and FIG. 11a, a pattern of the polysilicon layer 01 is formed, and the pattern of the polysilicon layer 01 includes a first active portion 31 and a second active portion 32 of the first transistor B and further includes an active layer of the second transistor. FIG. 2 is a schematic cross-sectional diagram of FIG. 11a in the direction FF'.

As shown in FIG. 2, a first gate insulating layer 14 is formed. The first gate insulating layer 14 may be made of SiOx, SiNx, SiON, and the like, and may also be made of High k materials, such as AlOx, HfOx, and TaOx, and may be a single layer, multiple layers, or a composite layer.

As shown in FIG. 2 and FIG. 11b, forming a pattern of the first gate metal layer 02 includes: forming a metal thin film, and patterning the metal thin film to form a pattern of the first gate metal layer 02, which includes a gate electrode of the first transistor B, a gate electrode of the second transistor, and a gate line Gate. In order to simplify the structure of a sub-pixel driving circuit, the gate electrode of the first transistor B and the gate line Gate may be in an integral structure. The metal thin film may be made of a metal material, such as Ag, Cu, Al, and Mo, or alloy materials of the above metals, such as AlNd and MoNb, may be formed by multilayer metals, such as Mo/Cu/Mo, or may be a stack structure formed by a metal and a transparent conductive material, such as ITO/Ag/ITO. FIG. 2 is a schematic cross-sectional diagram of FIG. 11b in the FF direction.

As shown in FIG. 2 and FIG. 11c, a second gate insulating layer 18 is formed, the second gate insulating layer 18 may be made of SiOx, SiNx, SiON, and the like, and may also be made of High k materials, such as AlOx, HfOx, and TaOx, and may be a in single layer, multiple layers, or a composite layer. The second gate insulating layer 18 is etched to form an opening 03. FIG. 2 is a schematic cross-sectional diagram of FIG. 11c in the FF direction.

As shown in FIG. 3, FIG. 4, and FIG. 11d, forming a pattern of the second gate metal layer 04 including: forming a metal thin film, and patterning the metal thin film to form a pattern of the second gate metal layer 04 as an electrode plate of a storage capacitor of a sub-pixel driving circuit. The metal thin film may be made of metal materials, such as Ag, Cu, Al, and Mo, or alloy materials of the above metals, such as AlNd and MoNb, may be made of multilayer metals, such as Mo/Cu/Mo, or may be a stack structure formed of a metal and a transparent conductive material, such as ITO/Ag/ITO. FIG. 4 is a schematic cross-sectional diagram of FIG. 11b in the FF direction.

As shown in FIG. 5, a layer of metal oxide semiconductor material is deposited to form a second active layer 10, and the second active layer 10 may be made of IGZO.

As shown in FIG. 6 and FIG. 11e, the second active layer 10 is etched and a pattern of the second active layer 10 is formed. In order to reduce the influence on the second gate metal layer, the second active layer 10 may be etched through a wet etching process, and the second active layer 10 is connected to the first active portion 31 and the second active portion 32 through the opening 03. FIG. 6 is a schematic cross-sectional diagram of FIG. 11e in the FF' direction.

As shown in FIG. 7, an intermediate insulating layer 20 is formed, the intermediate insulating layer 20 may be made of SiOx, SiNx, SiON, and the like, and may also be made of High k materials, such as AlOx, HfOx, TaOx, and the like, and may be in a single layer, multiple layers, or a composite layer. An orthographic projection of the intermediate insulating layer 20 onto the base substrate covers an orthographic projection of the opening onto the base substrate.

As shown in FIG. 8, FIG. 9, and FIG. 11f, the intermediate insulating layer 20 is etched to form a via hole 05, and the via hole 05 includes via holes 21 to 24 and the via hole 05 exposes the active layer of the thin film transistor. FIG. 8 and FIG. 9 are schematic cross-sectional diagrams of FIG. 11f in the FF' direction.

As shown in FIG. 11g, a pattern of a source and drain metal layer 06 is formed, and the pattern of the source and drain metal layer 06 includes a source electrode and a drain electrode of the thin film transistor, and the source electrode and the drain electrode of the thin film transistor are connected to an active layer of the thin film transistor through the via hole 05.

As shown in FIG. 11h, a first electrode 08 of the light-emitting unit and a data line Vdata are formed, and the first electrode 08 of the light-emitting unit may be an anode of the light-emitting unit.

In this embodiment, the sub-pixel driving circuit includes: a reset transistor T1, a compensation transistor T2, a data writing transistor T4, an initialization transistor T7, a first light-emitting control transistor T5, and a second light-emitting control transistor T6;

a gate electrode of the reset transistor T1 is coupled to a corresponding one of the reset line Reset, a first electrode of the reset transistor T1 is coupled to a corresponding one of the initialization signal line Vinit, and a second electrode of the reset transistor T1 is coupled to a gate electrode of the driving transistor T3;

a gate electrode of the compensation transistor T2 is coupled to a corresponding one of the gate line, a first electrode of the compensation transistor T2 is coupled to a gate electrode of the driving transistor T3, and a second electrode of the compensation transistor T2 is coupled to a drain electrode of the driving transistor T3;

a gate electrode of the data writing transistor T4 is coupled to a corresponding one of the gate line, a first electrode of the data writing transistor T4 is coupled to a corresponding one of the data line Vdata, and a second electrode of the data writing transistor T4 is coupled to a source electrode of the driving transistor T3;

a gate electrode of the first light-emitting control transistor T5 is coupled to a corresponding one of the light-emitting control line EM, a first electrode of the first light-emitting control transistor T5 is coupled to a first electrode 08 of the light-emitting unit, and a second electrode of the first light-emitting control transistor T5 is coupled to the drain electrode of the driving transistor T3;

a gate electrode of the second light-emitting control transistor T6 is coupled to a corresponding one of the light-emitting control line EM, a first electrode of the second light-emitting control transistor T6 is coupled to a corresponding one of the power supply line Vdd, and a second electrode of the second light-emitting control transistor T6 is coupled to a source electrode of the driving transistor T3; and a gate electrode of the initialization transistor T7 is coupled to a corresponding one of the gate line, a first electrode of the initialization transistor T7 is coupled to the corresponding initialization signal line, and a second electrode of the initialization transistor T7 is coupled to the first electrode 08 of a light-emitting unit.

The reset transistor T1, the compensation transistor T2, the data writing transistor T4, and the initialization transistor T7 are LTPO transistors, i.e., the first transistors, and the other transistors are the second transistors.

In the present embodiment, the first active layer of the first transistor, i.e., the polysilicon layer, and the active layer of the second transistor are arranged in a same layer and made of a same material; the via hole exposing the first active layer and the via hole exposing the active layer of the second transistor can be formed by the same patterning process; the etching depths of the plurality of via holes exposing the first active layer and exposing the active layer of the second transistor are the same or substantially the same, thus avoiding situations such as non-uniform critical dimensions and abnormal slope angles due to different via depths and ensuring product yield.

Figure 12:
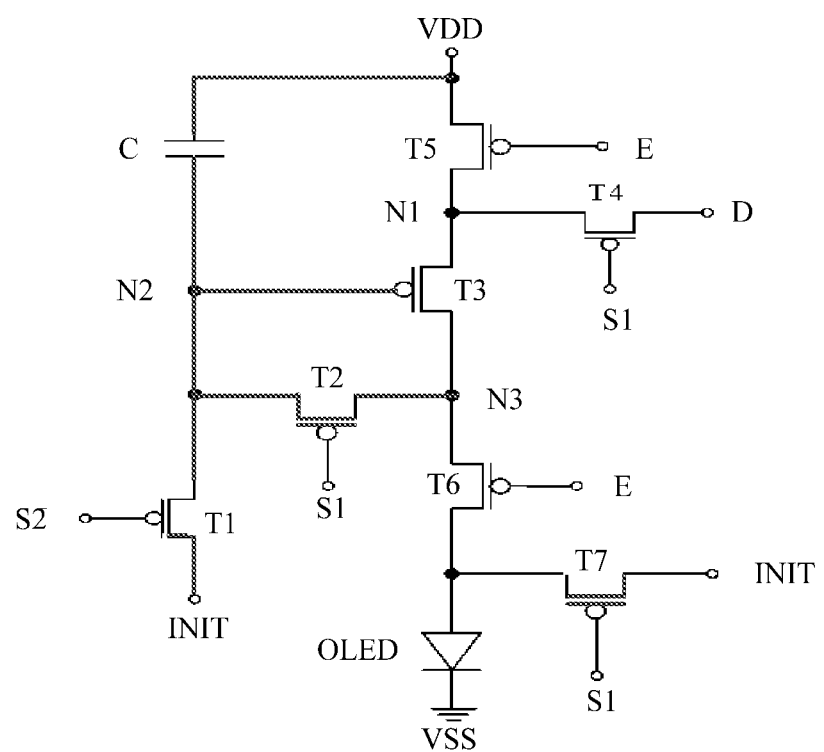
FIG. 12 is an equivalent circuit diagram of a sub-pixel driving circuit according to embodiments of the present disclosure.

FIG. 12 is an equivalent circuit diagram of a sub-pixel driving circuit according to embodiments of the present disclosure, and the operation process of the sub-pixel driving circuit may include: in a reset phase, a signal of a second scanning signal line S2 is a low-level signal, which enable the reset transistor T1 to be turned on, and a signal of the initialization signal line Vinit is provided to a second node N2 to initialize the storage capacitor C and clear an original data voltage in the storage capacitor. The signals of the first scanning signal line S1 and the light-emitting signal line E are high-level signals, so that the compensation transistor T2, the data writing transistor T4, the first light-emitting control transistor T5, the second light-emitting control transistor T6, and the initialization transistor T7 are turned off, and the light-emitting element OLED does not emit light at this stage.

In a data writing phase or a threshold compensation phase, since the second end of the storage capacitor C is at a low level, the driving transistor T3 is turned on. The signal of the first scanning signal line S1 is a low-level signal, so that the compensation transistor T2, the data writing transistor T4, and the initialization transistor T7 are turned on. The compensation transistor T2 and the data writing transistor T4 are turned on, so that the data voltage output by the data signal line D is provided to the second node N2 through the first node N1, the turned-on driving transistor T3, the third node N3, and the turned-on compensation transistor T2, and the difference between the data voltage output by the data signal line D and the threshold voltage of the driving transistor T3 is filled into the storage capacitor C. The voltage at the second end (the second node N2) of the storage capacitor C is Vd-Vth, Vd is the data voltage output by the data signal line D; and Vth is the threshold voltage of the driving transistor T3. The initialization transistor T7 is turned on, so that the initial voltage of the initial signal line INIT is provided to the first electrode of the light-emitting element OLED, initializes (resets) the first electrode of the light-emitting element OLED, clears the pre-stored voltage therein, completes the initialization, and ensures that the light-emitting element OLED does not emit light. The signal of the second scanning signal line S2 is a high-level signal so that the reset transistor T1 is turned off. The signal of the light-emitting signal line E is a high-level signal, so that the first light-emitting control transistor T5 and the second light-emitting control transistor T6 are turned off.

In a light-emitting stage, the signal of the light-emitting signal line E is a low-level signal, so that the first light-emitting control transistor T5 and the second light-emitting control transistor T6 are turned on. The power supply voltage outputted by the first power supply line VDD provides a drive voltage to the first electrode of the light-emitting element OLED through the turned-on first light-emitting control transistor T5, the driving transistor T3, and the second light-emitting control transistor T6, thus driving the light-emitting element OLED to emit light.

During driving by the pixel driving circuit, a drive current flowing through the driving transistor T3 is determined by a voltage difference between the gate electrode and the first electrode thereof. Since the voltage of the second node N2 is Vdata−|Vth|, the driving current of the driving transistor T3 is:

$$I=K*(Vgs-Vth)^2=K*[(Vdd-Vd+|Vth|)-Vth]^2=K*[(Vdd-Vd]^2$$

where I is the driving current flowing through the driving transistor T3, i.e., a driving current for driving the light-emitting element OLED; K is a constant; Vgs is a voltage difference between the gate electrode and the first electrode of the driving transistor T3; Vth is a threshold voltage of the driving transistor T3; Vd is a data voltage output by the data signal line D; and Vdd is a power supply voltage output by the first power supply line VDD.

It should be noted that the various embodiments described herein are described in a progressive manner with reference to the same or similar parts throughout the various embodiments, with each embodiment focusing on a difference from the other embodiments. In particular, the embodiments are described more simply because they are approximately like the product embodiments, with reference to the partial description of the product embodiments.

Unless defined otherwise, technical, or scientific terms used in the present disclosure shall have the ordinary meaning as understood by one of ordinary skill in the art to which this disclosure belongs. Such terms as "first", "second" used in the present disclosure do not denote any order, quantity, or importance, but rather is used to distinguish one element from another. Such terms as "including" or "comprises" mean that the presence of an element or item preceding the word covers the presence of the element or item listed after the word and equivalents thereof, but does not exclude other elements or items. Such terms as "connected" or "coupled" are not limited to physical or mechanical connections, but may include electrical connections, whether direct or indirect. Such terms as "upper", "lower", "left", "right" are used only to indicate relative positional relationships that may change accordingly when the absolute position of the object being described changes.

It should be understood that when an element such as a layer, film, region, or substrate is referred to as being "on" or "under" another element, it can be "directly on" or "directly under" the other element or intervening elements may be present.

In the description of the embodiments above, particular features, structures, materials, or characteristics may be combined in any suitable manner in any one or more embodiments or examples.

While the foregoing embodiments are directed to the specific implementations of the present disclosure, it will be understood by those skilled in the art that numerous modifications and substitutions can be made without departing from the principles of the disclosure, and such modifications and substitutions shall fall within the protection scope of the present disclosure.

What is claimed is:

1. A display substrate, comprising: a base substrate and a plurality of sub-pixels on the base substrate, the sub-pixels comprising a sub-pixel driving circuit and a light-emitting element, wherein the sub-pixel driving circuit comprises:
   a first transistor and a second transistor;
   an active layer structure of the first transistor comprises a first active layer and a second active layer connected to the first active layer, the second active layer is located at a side of the first active layer away from the base substrate, the first active layer comprises a first active portion and a second active portion that are independent from each other, and the first active portion and the second active portion are respectively connected to two ends of the second active layer,
   wherein the first active layer and the second active layer are made of different materials, and the first active layer and an active layer of the second transistor are arranged in a same layer and made of a same material.

2. The display substrate according to claim 1, wherein the first active layer is made of polysilicon; and
   the second active layer is made of a metal oxide semiconductor.

3. The display substrate according to claim 2, wherein the first transistor further comprises:
   a gate electrode located on a side of the second active layer facing the base substrate, wherein the gate electrode is located on a side of the first active layer away from the base substrate.

4. The display substrate according to claim 3, wherein the gate electrode of the first transistor and a gate electrode of the second transistor are arranged in a same layer and made of a same material.

5. The display substrate according to claim 3, comprising the first active layer, a first gate insulating layer, the gate electrode, a second gate insulating layer, the second active layer that are located on the base substrate in sequence, wherein the display substrate further comprises an opening penetrating the first gate insulating layer and the second gate insulating layer, and the second active layer is connected to the first active layer through the opening.

6. The display substrate according to claim 5, further comprising:
   an intermediate insulating layer located on a side of the second active layer away from the base substrate, wherein an orthographic projection of the intermediate insulating layer onto the base substrate covers an orthographic projection of the opening onto the base substrate; and
   a source electrode and a drain electrode located at a side of the intermediate insulating layer away from the base substrate, wherein the source electrode and the drain electrode of the first transistor are connected to the first active layer through a via hole penetrating an insulating layer, and the insulating layer is the intermediate insulating layer, or the intermediate insulating layer, the first gate insulating layer and the second gate insulating layer,
   wherein the source electrode and the drain electrode of the second transistor are connected to the active layer of the second transistor through a via hole penetrating the intermediate insulating layer, the first gate insulating layer and the second gate insulating layer.

7. The display substrate according to claim 6, wherein in the first transistor, an orthographic projection of the via hole onto the base substrate at least partially overlaps the orthographic projection of the opening onto the base substrate; or
an orthographic projection of the via hole onto the base substrate does not overlap the orthographic projection of the opening onto the base substrate.

8. The display substrate according to claim 1, wherein the display substrate comprises a plurality of power supply lines, a plurality of light-emitting control lines, a plurality of gate lines, a plurality of data lines, a plurality of reset lines and a plurality of initialization signal lines;
the sub-pixel driving circuit comprises a reset transistor, a compensation transistor, a data writing transistor, an initialization transistor, a first light-emitting control transistor, a second light-emitting control transistor, and a driving transistor;
a gate electrode of the reset transistor is coupled to a corresponding one of the reset lines, a first electrode of the reset transistor is coupled to a corresponding one of the initialization signal lines, and a second electrode of the reset transistor is coupled to a gate electrode of the driving transistor;
a gate electrode of the compensation transistor is coupled to a corresponding one of the gate lines, a first electrode of the compensation transistor is coupled to the gate electrode of the driving transistor, and a second electrode of the compensation transistor is coupled to a drain electrode of the driving transistor;
a gate electrode of the data writing transistor is coupled to a corresponding one of the gate lines, a first electrode of the data writing transistor is coupled to a corresponding one of the data lines, and a second electrode of the data writing transistor is coupled to a source electrode of the driving transistor;
a gate electrode of the first light-emitting control transistor is coupled to a corresponding one of the light-emitting control lines, a first electrode of the first light-emitting control transistor is coupled to a first electrode of a light-emitting unit, and a second electrode of the first light-emitting control transistor is coupled to the drain electrode of the driving transistor;
a gate electrode of the second light-emitting control transistor is coupled to a corresponding one of the light-emitting control lines, a first electrode of the second light-emitting control transistor is coupled to a corresponding one of the power supply lines, and a second electrode of the second light-emitting control transistor is coupled to the source electrode of the driving transistor; and
a gate electrode of the initialization transistor is coupled to a corresponding one of the gate lines, a first electrode of the initialization transistor is coupled to a corresponding one of the initialization signal lines, and a second electrode of the initialization transistor is coupled to the first electrode of the light-emitting unit.

9. The display substrate according to claim 8, wherein the first transistor comprises the reset transistor, the compensation transistor, the data writing transistor and the initialization transistor; or
the first transistor comprises the reset transistor and the compensation transistor.

10. The display substrate according to claim 9, wherein an orthographic projection of the first active layer of the first transistor onto the base substrate does not overlap orthographic projections of the gate lines onto the base substrate.

11. The display substrate according to claim 9, wherein a connection line between the second electrode of the data writing transistor and the source electrode of the driving transistor comprises first connection portions and a second connection portion, the first connection portion and the first active layer are arranged in the same layer and made of the same material, the second connection portion is fabricated by a source and drain metal layer, the first connection portions are broken at a position where the connection line and the light-emitting control line intersect, and the broken first connection portions are connected through the second connection portion.

12. A display device, comprising the display substrate according to claim 1.

13. A method for manufacturing a display substrate, comprising: forming a plurality of sub-pixels on a base substrate, the sub-pixels comprising a sub-pixel driving circuit and a light-emitting element, wherein forming the sub-pixel driving circuit comprises:
forming a first transistor and a second transistor;
an active layer structure of the first transistor comprises a first active layer and a second active layer connected to the first active layer, the second active layer is located at a side of the first active layer away from the base substrate, the first active layer comprises a first active portion and a second active portion that are independent from each other, and the first active portion and the second active portion are respectively connected to two ends of the second active layer,
wherein the first active layer and the second active layer are made of different materials, and the first active layer and the active layer of the second transistor are formed by one patterning process.

14. The method for manufacturing a display substrate according to claim 13, comprising:
forming the second active layer in a wet etching process.

* * * * *